United States Patent [19]

Hsu et al.

[11] Patent Number: 4,647,799
[45] Date of Patent: Mar. 3, 1987

[54] FULL AND FRACTIONAL SWING WITH ADJUSTABLE HIGH LEVEL ECL GATE USING A SINGLE CURRENT SOURCE

[75] Inventors: Mei Hsu; Thomas H. Wong, both of Sunnyvale, Calif.

[73] Assignee: Advanced Micro Devices, Inc., Sunnyvale, Calif.

[21] Appl. No.: 626,364

[22] Filed: Jun. 29, 1984

[51] Int. Cl.[4] ............... H03K 19/013; H03K 19/092; H03L 5/00
[52] U.S. Cl. .................................. 307/455; 307/475; 307/264
[58] Field of Search ............... 307/455, 475, 264, 467, 307/317 A

[56] References Cited

FOREIGN PATENT DOCUMENTS 0097857  1/1984  European Pat. Off. ............ 307/475
2110029  6/1983  United Kingdom ................ 307/455

OTHER PUBLICATIONS

TTL Decoder for Bipolar Arrays, I.B.M. Tech. Disc. Bul., vol. 27, No. 2, Jul. 1984.

Primary Examiner—Stanley D. Miller
Assistant Examiner—M. R. Wambach
Attorney, Agent, or Firm—Patrick T. King; Davis Chin; J. Vincent Tortolano

[57] ABSTRACT

An emitter coupled gate circuit for providing both a full output voltage swing and a fractional output voltage swing with an adjustable high level output voltage includes a single differential transistor circuit having a first current switch transistor and a second current switch transistor and a single constant-current source. A first load resistor has its one end connected operatively to the collector of the second current switch transistor. A second load resistor has its one end connected operatively to the collector of the second current switch transistor, and a level shifting resistor has its one end connected to the other end of the second load resistor. A first emitter follower transistor has its base connected to the one end of the first load resistor and its emitter connected to an upper-level full output voltage swing terminal. A second emitter follower transistor has its base connected to the one end of the second load resistor and its emitter connected to an upper-level fractional output voltage swing terminal. The upper-level fractional output voltage swing terminal has an adjustable high level output voltage which is controlled by the ratios of the resistance values of the level shifting resistor relative to the first load resistor and the second load resistor.

1 Claim, 3 Drawing Figures

FULL AND FRACTIONAL SWING WITH ADJUSTABLE HIGH LEVEL ECL GATE USING A SINGLE CURRENT SOURCE

BACKGROUND OF THE INVENTION

1. Field of the Invention

The present invention relates generally to ECL (Emitter Coupled Logic) circuitry and more particularly, it relates to an emitter coupled logic gate circuit which provides both a full output voltage swing and a fractional output voltage swing having an adjustable high level output voltage by using a single ECL gate current source.

2. Description of the Prior Art

Heretofore, circuitry in the prior art for generating both a full output voltage swing and a fractional output voltage swing having an adjustable high level output voltage required two separate and distinct emitter coupled logic gates each with its own current source. This suffered from the disadvantage of increased power consumption, an increased number of components for constructing the circuit, and a slower operating speed due to two gates sharing the same power source. Due to the increased components, there is further presented the defect of occupying more space area thereby increasing the cost of manufacturing.

An ECL circuit of such prior art is shown in FIG. 1 which has been labelled "Prior Art". Thus, it can be seen that there are required two emitter coupled logic circuits constructed as differential transistor circuits. The first differential transistor circuit is composed of transistors Q20 and Q40 whose emitters are commonly connected together and tied to a first constant-current source. The first current source is formed by a transistor Q60 and a resistor R. The second differential transistor circuit is composed of transistor Q80 and Q100 whose emitters are commonly connected together and tied to a second constant-current source. The second current source is formed by a transistor Q120 and a resistor R.

It would therefore be desirable to provide an emitter coupled logic gate circuit which provides both a full output voltage swing and a fractional output voltage swing, but is realized by using only a single ECL gate current source. Thus, the complexity of the ECL circuit of the present invention is reduced so as to simplify its construction.

SUMMARY OF THE INVENTION

It is a general object of the present invention to provide an emitter coupled logic gate circuit which is capable of operating at high speeds, consuming less electrical power and occupying less space area.

It is another object of the present invention to provide an emitter coupled logic gate circuit which provides both a full output voltage swing and a fractional output voltage swing having an adjustable high level output voltage by utilizing a single ECL gate current source.

It is another object of the present invention to provide an emitter coupled logic gate circuit having both a full output voltage swing and a fractional output voltage swing with an adjustable high level output voltage consisting of a single differential transistor circuit and a single constant-current source connected to the differential transistor circuit.

It is still another object of the present invention to provide an emitter coupled logic gate circuit having both a full output voltage swing and a fractional output voltage swing with an adjustable high level output level voltage which is controlled by resistance ratios.

In accordance with these aims and objectives, the instant invention is concerned with the provision of an emitter coupled logic gate circuit having both a full output voltage swing and a fractional output voltage swing with an adjustable high level output voltage which includes a single differential transistor circuit. The transistor circuit includes a first current switch transistor and a second current switch transistor. The base electrode of the first transistor is connected operatively to a signal input terminal, and the base electrode of the second transistor is connected operatively to a reference potential. The emitters of the first and second transistors are commonly connected together. A single constant-current source is connected to the emitters of the first and second transistors. A first load resistor has its first end connected operatively to the collector of the second transistor and its second end connected to a supply potential. A first emitter follower transistor has its base connected to the first end of the first load resistor, its collector connected to the supply potential and its emitter connected to an upper-level full output voltage swing terminal. A second load resistor has its first end coupled to the collector of the second transistor. A level shifting resistor has its first end connected to a second end of the second load resistor and its other end connected to the supply potential. A second emitter follower transistor has its base connected to the one end of the second load resistor, its collector connected to the supply potential and its emitter connected to an upper-level fractional output voltage swing terminal. The upper-level fractional output voltage swing terminal has an adjustable high level output voltage which is controlled by the ratios of the resistance values of the level shifting resistor to the first load resistor and the second load resistor.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout wherein.

DESCRIPTION OF THE PREFERRED EMBODIMENT

Figure 2:
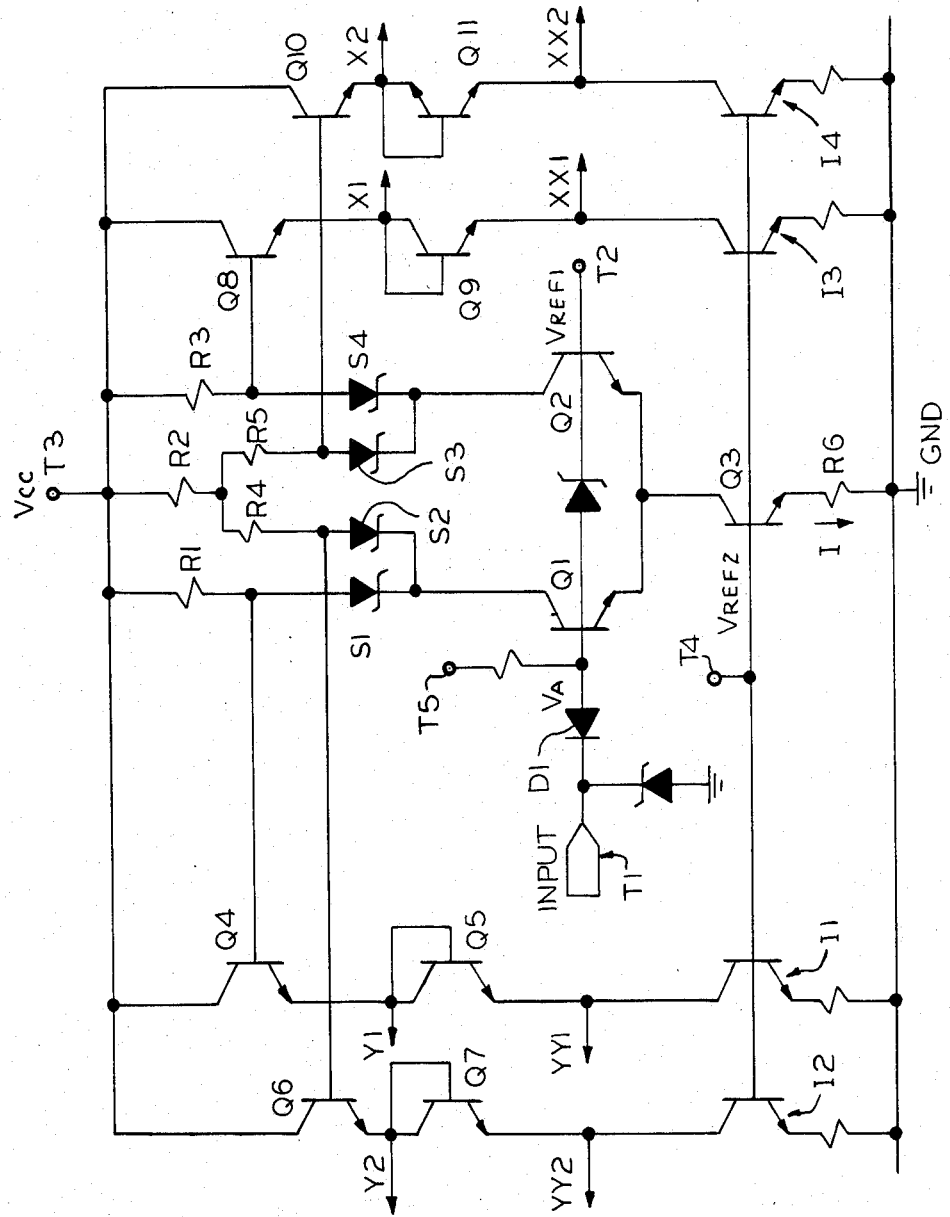
FIG. 2 is a schematic circuit diagram of an ECL circuit according to the present invention.

Referring now in detail to the various views of the drawings, there is shown in FIG. 2 an emitter coupled logic gate circuit of the present invention which includes a single differential transistor circuit consisting of a first current switch transistor Q1 whose base is connected operatively to an input circuit terminal T1 via a diode D1 and a second current switch transistor Q2 whose base is connected to a circuit terminal T2. A constant-current source formed of transistor Q3 and resistor R6 is connected between the emitters of the transistors Q1, Q2 which are commonly connected together and ground GND. Load resistors R1, R3 are connected between a circuit terminal T3 and the collectors of the transistors Q1, Q2 via respective diodes S1, S4. First ends of load resistors R4, R5 are also connected via diodes S2, S3 to the respective collectors of the transistors Q1, Q2. A level shifting resistor R2 is connected between the circuit terminal T3 and second ends of the collector load resistors R4, R5 which are commonly connected together.

An input signal, which is either high or low, is applied to the input terminal T1, and a reference voltage $V_{REF1}$ is applied to the circuit terminal T2. A power supply voltage or potential $V_{CC}$ is applied to the circuit terminal T3. A second reference voltage $V_{REF2}$ is applied to a circuit terminal T4, which is connected to the base of the transistor Q3. An optional reference voltage VA may be supplied through terminal T5 which is a complementary signal to the first reference voltage $V_{REF1}$.

A first emitter follower output circuit formed of transistor Q4 is connected to the collector of the transistor Q1 via the diode S1. The collector of the transistor Q4 is tied to the circuit terminal T3. A transistor Q5 connected in the manner of a diode is tied to the emitter of transistor Q4 and serves as a level shifting means. The junction of the emitter of the transistor Q4 and the base-collector of the transistor Q5 is joined to an output circuit terminal Y1. The emitter of the transistor Q5 is coupled to an output terminal YY1, and to a current source I1. A second emitter follower output circuit formed of transistor Q6, the collector of which is tied to the circuit terminal T3. A transistor Q7 connected in the manner of a diode is tied to the emitter of the transistor Q6 and serves as a level shifting means. The junction of the emitter of the transistor Q6 and the base-collector of the transistor Q7 is joined to an output circuit terminal Y2. The emitter of the transistor Q7 is coupled to an output circuit terminal YY2 and to a current source I2.

Similarly, a third emitter follower output circuit formed of transistor Q8 is connected to a collector of the transistor Q2 via the diode S4. The collector of the transistor Q8 is tied to the circuit terminal T3. A transistor Q9 connected in the manner of a diode is tied to the emitter of the transistor Q8 and serves as a level shifting means. The junction of the emitter of the transistor Q8 and the base-collector of the transistor Q9 is joined to an output circuit terminal X1. The emitter of the transistor Q9 is coupled to an output terminal XX1 and to a current source I3. A fourth emitter follower output circuit formed of transistor Q10 is also connected to the collector of the transistor Q2 via the diode S3. The collector of the transistor Q10 is tied to the circuit terminal T3. A transistor Q11 connected in the manner of a diode is tied to the emitter of the transistor Q10 and serves as a level shifting means. The junction of the emitter of the transistor Q10 and the base-collector of the transistor Q11 is joined to an output circuit terminal X2. The emitter of the transistor Q11 is coupled to an output terminal XX2 and to a current source I4.

The output terminals X1, X2, Y1 and Y2 are defined as the upper-level output nodes, and the output terminals XX1, XX2, YY1 and YY2 are defined as the lower-level output nodes. While the diodes S1 through S4 may be formed as non-Schottky diodes, it will be preferable to construct them as such so as to reduce area since they can be incorporated in the same isolation area as the transistors Q1, Q2. Further, it should be understood by those skilled in the art that the emitter coupled logic gate circuit of the present invention may be constructed in the form of a monolithic semiconductor integrated circuit.

Figure 1:
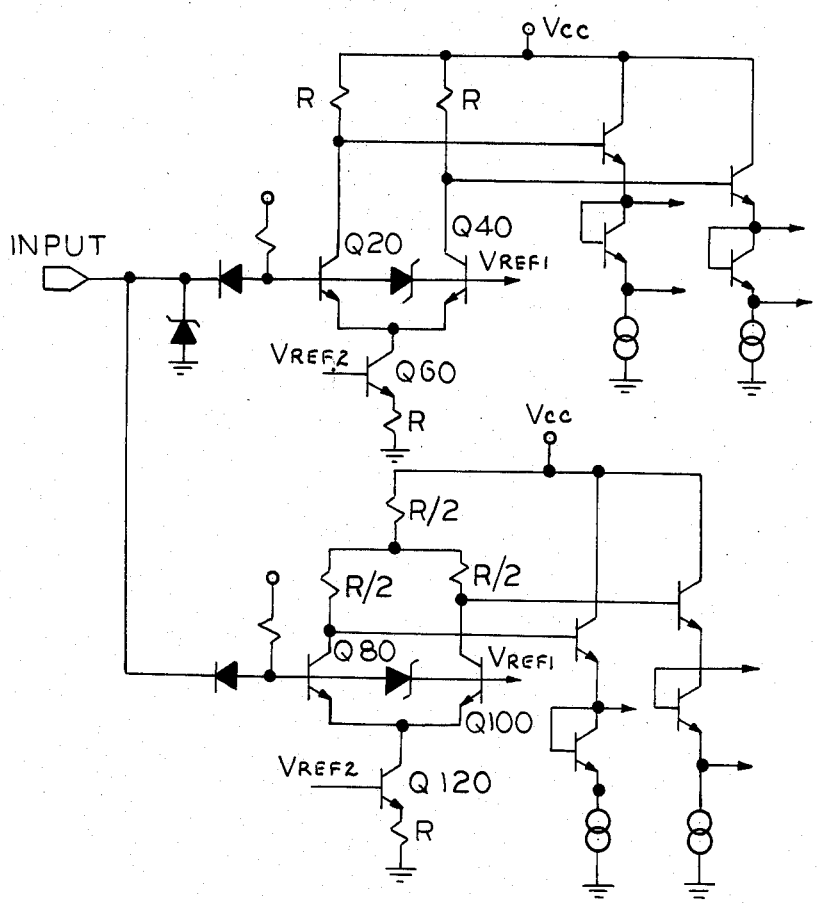
FIG. 1 is a schematic circuit diagram of an ECL circuit according to the prior art.
Figure 3:
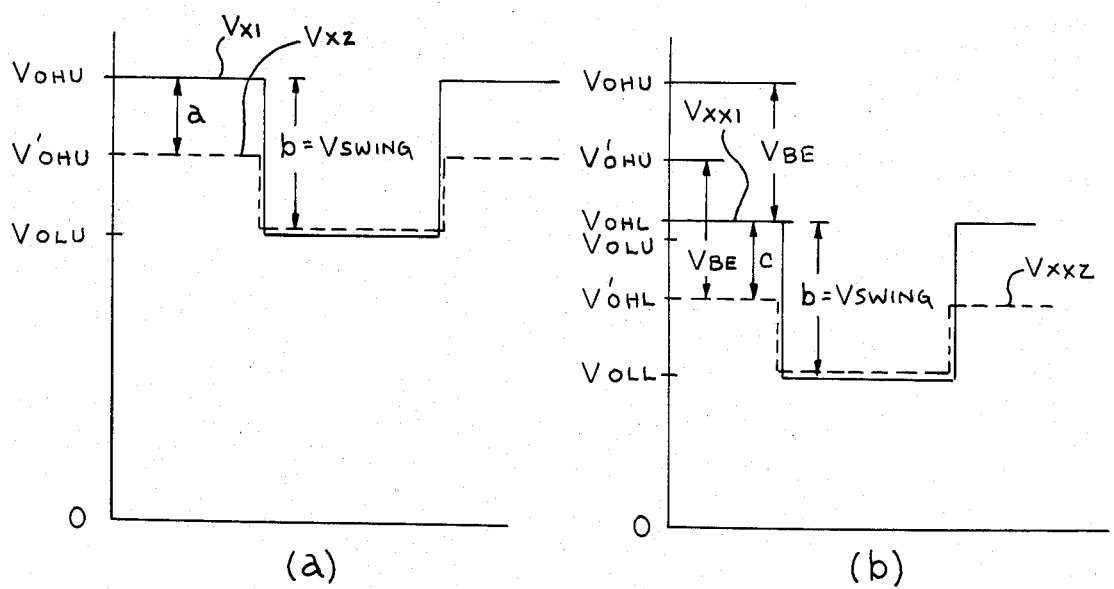
FIGS. 3(a) and (b) illustrate the full and fractional voltage swings of FIG. 2.

In order to provide an understanding of the operation of the emitter logic gate circuit of FIG. 2, reference is now made to the graphs of FIGS. 3(a) and 3(b). There is shown in 3(a), as indicated by the solid line, the full voltage swing $V_{SWING}$ or b between an upper-level output high voltage $V_{OHU}$ and an upper-level output low voltage $V_{OLU}$. This is the waveform that appears at the upper-level output node X1 and is designated $V_{X1}$ when the input signal on the circuit terminal T1 is going from high to low. The dotted line of FIG. 3(a) is the voltage waveform that appears at the upper-level output node X2 and is designated $V_{X2}$. This waveform has an upper-level output high voltage with an adjustable high level $V'_{OHU}$ and an upper-level output low voltage $V_{OLU}$. When the input signal is high, the transistor Q1 is turned on and the transistor Q2 is turned off. When the input signal is low, the transistor Q1 is turned off and the transistor Q2 is turned on.

The high level $V'_{OHU}$ is adjusted by selecting a fraction x, where $$x = \frac{a}{b} = \frac{V_{OHU} - V'_{OHU}}{V_{OHU} - V_{OLU}}$$

The fraction x is controlled by adjusting the ratios of the resistance values of the level shifting resistor R2 relative to the other resistors R1, R3, R4, R5 and R6. Thus, the amount that the adjustable high level voltage $V'_{OHU}$ is lower than $V_{OHU}$ will be determined by the voltage drop across the level shifting resistor R2. If the resistor R2 is selected to have a value of R, then the other resistor values should be made as follows:

$$R1 = R3 = (N + 1)R$$
$$R4 = R5 = NR$$
$$R6 = \frac{N + 1}{2} R$$

where $N = 1/x - 1$

For example, assuming x is equal to one-half ($\frac{1}{2}$) then N is determined to be equal to one (1). Thus, when R2=R the resistors R1 and R3 should be made equal to 2R, the resistors R4 and R5 should be made equal to R, and the resistor R6 should be made equal to R.

There is shown in FIG. 3(b), as indicated by the solid line, the full voltage swing $V_{SWING}$ or b between a lower-level output high voltage $V_{OHL}$ and a lower-level output low voltage $V_{OLL}$. This is the waveform that appears at the lower-level output node XX1 and is designated $V_{XX1}$ when the input signal on the circuit terminal T1 is going from high to low. As can be seen by comparing FIG. 3(b) with 3(a), the waveform $V_{XX1}$ is merely shifted down by a voltage $V_{BE}$ across the base and emitter of the transistor Q9 from the waveform $V_{X1}$. Thus, this is the reason for referring to the terminal X1 as the upper-level output node, and the terminal XX1 as the lower-level output node. Similarly, the dotted line of FIG. 3(b) is the waveform which has an adjustable high level $V'_{OHL}$ and the lower-level output low voltage $V_{OLL}$, and that appears at the lower-level output node XX2 when the input signal is going from high to low. Again, the waveform $V_{XX2}$ is merely shifted down by a voltage $V_{BE}$ across the base and emitter of the transistor Q11 from the waveform $V_{X2}$ of FIG. 3(a).

The high level voltage $V'_{OHL}$ will be determined by the selection of the fraction x, where $$x = \frac{c}{b} = \frac{V_{OHL} - V'_{OHL}}{V_{OHL} - V_{OLL}} \qquad 5$$

As was previously discussed with reference to FIG. 3(a), the fraction x will be controlled by the ratio of the resistance values of the level shifting resistor R2 relative to the other resistors R1, R3, R4, R5 and R6.

A complementary waveform of $V_{X1}$ will appear at the output node Y1 and is designated $V_{Y1}$. Similarly, complementary waveforms of $V_{X2}$, $V_{XX1}$ and $V_{XX2}$ will appear at the output nodes Y2, YY1 and YY2 and are designated $V_{Y2}$, $V_{YY1}$ and $V_{YY2}$ respectively. In other words, the same waveform as $V_{X1}$ will appear at the output node Y1 when the input signal at terminal T1 is going from low to high. Likewise, the same waveforms as $V_{X2}$, $V_{XX1}$ and $V_{XX2}$ will appear at the output nodes Y2, YY1 and YY2 when the input signal is going from low to high.

From the foregoing detailed description, it can thus be seen that the present invention provides an improved emitter coupled logic gate circuit having both a full output voltage swing and a fractional output voltage swing with an adjustable high level output voltage utilizing a single ECL gate current source. The ECL gate circuit of the present invention is capable of operating at high speeds, consuming less electrical power and occupying less space area due to the use of the single ECL gate current source.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or a material to the teachings of the invention without departing from the central scope thereof. Therefore, it is intended that this invention not be limited to the particular embodiment disclosed as the best mode contemplated for carrying out this invention, but that the invention will include all embodiments falling within the scope of the appended claims.

What is claimed is:

1. An emitter coupled logic gate circuit for providing both a full output voltage swing and a fractional output voltage swing with an adjustable high level output voltage, said emitter coupled logic gate circuit comprising;
   a single differential transistor circuit having a first current switch transistor and a second current switch transistor, said first current switch transistor having its base electrode coupled to a signal input terminal and said second current switch transistor having its base electrode connected to a reference potential, the emitters of said first and second current switch transistors being commonly connected together;
   a single constant-current source being connected to the emitters of said first and second transistors;
   a first Schottky diode having an anode and a cathode, the cathode of the first Schottky diode being connected to the collector of said second current switch transistor;
   a first load resistor having its first end connected to the anode of the first Schottky diode and its second end connected to a supply potential;
   a first emitter follower transistor having its base connected to said first end of said first load resistor, its collector connected to said supply potential, and its emitter connected to an upper-level output voltage swing terminal;
   a second Schottky diode having an anode and a cathode, the cathode of the second Schottky diode being connected to the collector of said second current switch transistor;
   a second load resistor having its first end connected to the anode of the second Schottky diode;
   a level shifting resistor having its first end connected to a second end of said second load resistor and its second end connected to said supply potential;
   a second emitter follower transistor having its base connected to said first end of said second load resistor, its collector connected to said supply potential, and its emitter connected to an upper-level fractional output voltage swing terminal;
   a first level shifting transistor having its base and collector connected together to form a diode, said base and collector being further connected to said emitter of said first emitter follower transistor, said emitter of said first level shifting transistor being connected to a lower-level full output voltage swing terminal;
   a second level shifting transistor having its base and collector connected together to form a diode, said base and collector being further connected to said emitter of said second emitter follower transistor, said emitter of said second level shifting transistor being connected to a lower-level fractional output voltage swing terminal;
   said upper-level and lower-level fractional output voltage swing terminals having adjustable high level output voltages controlled by the ratio of the resistance values of the level shifting resistor relative to said first load resistor and said second load resistor;
   a third Schottky diode having an anode and a cathode, the cathode of the third Schottky diode being connected to the collector of said first current switch transistor;
   a third load resistor having its first end connected to the anode of the third Schottky diode and its second end connected to a supply potential;
   a third emitter follower transistor having its base connected to said first end of said third load resistor, its collector connected to said supply potential, and its emitter connected to a complementary upper-level output voltage swing terminal;
   a fourth Schottky diode having an anode and a cathode, the cathode of the fourth Schottky diode being connected to the collector of said first current switch transistor;
   a fourth load resistor having its first end connected to the anode of the fourth Schottky diode and its second end connected to the first end of said level shifting resistor;
   a fourth emitter follower transistor having its base connected to said first end of said fourth load resistor, its collector connected to said supply potential, and its emitter connected to a complementary upper-level fractional output voltage swing terminal;

a third level shifting transistor having its base and collector connected together to form a diode, said base and collector being further connected to said emitter of said third emitter follower transistor, said emitter of said third level shifting transistor being connected to a complementary lower-level full output voltage swing terminal;

a fourth level shifting transistor having its base and collector connected together to form a diode, said base and collector being further connected to said emitter of said fourth emitter follower transistor, said emitter of said fourth level shifting transistor being connected to a complementary lower-level fractional output voltage swing terminal;

said complementary upper-level and lower-level fractional output voltage swing terminals having adjustable high level output voltages controlled by the ratio of the resistance values of the level shifting resistor relative to said third load resistor and said fourth load resistor; and said emitter coupled logic gate circuit being formed in a monolithic semiconductor integrated circuit.

* * * * *